(12) United States Patent
Lee et al.

(10) Patent No.: US 7,452,825 B2
(45) Date of Patent: Nov. 18, 2008

(54) METHOD OF FORMING A MASK STRUCTURE AND METHOD OF FORMING A MINUTE PATTERN USING THE SAME

(75) Inventors: Doo-Youl Lee, Seongnam-si (KR); Han-Ku Cho, Seongnam-si (KR); Suk-Joo Lee, Yongin-si (KR); Gi-Sung Yeo, Seoul (KR); Cha-Won Koh, Yongin-si (KR); Sung-Gon Jung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 260 days.

(21) Appl. No.: 11/589,372

(22) Filed: Oct. 30, 2006

(65) Prior Publication Data
US 2008/0057610 A1     Mar. 6, 2008

(30) Foreign Application Priority Data
Aug. 29, 2006    (KR) ................. 10-2006-0082119

(51) Int. Cl.
  *H01L 21/44* (2006.01)
  *H01L 21/00* (2006.01)
(52) U.S. Cl. ................. 438/717; 438/736; 438/737; 438/738; 438/743; 438/744; 257/E21.014; 257/E21.035; 257/E21.038; 257/E21.633; 257/E21.639
(58) Field of Classification Search ............. 438/717, 438/736, 737, 738, 743, 744; 257/E21.014, 257/0.035, 0.038, 0.314, 0.633, 0.637, 0.639, 257/0.703
See application file for complete search history.

(56) References Cited

U.S. PATENT DOCUMENTS

| | | | |
|---|---|---|---|
| 5,581,110 A * | 12/1996 | Razouk et al. ............. 257/513 |
| 5,939,335 A | 8/1999 | Arndt et al. |
| 6,184,151 B1 * | 2/2001 | Adair et al. ................. 438/743 |
| 6,208,008 B1 | 3/2001 | Arndt et al. |
| 6,423,618 B1 * | 7/2002 | Lin et al. ..................... 438/589 |
| 6,584,609 B1 | 6/2003 | Pierrat et al. |
| 6,884,733 B1 * | 4/2005 | Dakshina-Murthy et al. ..... 438/717 |
| 7,230,287 B2 * | 6/2007 | Anderson et al. ........... 257/213 |

FOREIGN PATENT DOCUMENTS

| | | |
|---|---|---|
| JP | 11-274158 | 10/1999 |
| JP | 2004-004904 | 1/2004 |
| JP | 2004-093705 | 3/2004 |

* cited by examiner

*Primary Examiner*—Michael S Lebentritt
(74) *Attorney, Agent, or Firm*—Myers Bigel Sibley & Sajovec, P.A.

(57) ABSTRACT

In the method of forming a mask structure, a first mask is formed on a substrate where the first mask includes a first mask pattern having a plurality of mask pattern portions having openings therebetween and a second mask pattern having a corner portion of which an inner side wall that is curved. A sacrificial layer is formed on the first mask. A hard mask layer is formed on the sacrificial layer. After the hard mask layer is partially removed until the sacrificial layer adjacent to the corner portion is exposed, a second mask is formed from the hard mask layer remaining in the space after removing the sacrificial layer. A minute pattern having a fine structure may be easily formed on the substrate.

12 Claims, 6 Drawing Sheets

METHOD OF FORMING A MASK STRUCTURE AND METHOD OF FORMING A MINUTE PATTERN USING THE SAME

CROSS-REFERENCE TO RELATED APPLICATIONS

This application claims priority under 35 USC § 119 to Korean Patent Application No. 2006-82119 filed on Aug. 29, 2006, the contents of which are herein incorporated by reference in its entirety for all purposes.

FIELD OF THE INVENTION

The present invention relates generally to mask structures and, more particularly, to mask structures that serve as etching masks and methods of forming minute patterns using mask structures.

BACKGROUND OF THE INVENTION

With highly integrated semiconductor devices in demand over recent years, developing minute patterns required for manufacturing semiconductor devices has become important. For example, a self-alignment double patterning (SADP) process has been developed for forming a minute pattern having a high resolution.

According to the SADP process, a first mask pattern is formed on a substrate and then a sacrificial layer is successively formed on the first mask pattern. A hard mask layer is formed on the sacrificial layer and then the hard mask layer is partially etched to form a second mask pattern, to thereby form a mask structure including the first and the second mask patterns on the substrate.

As a result, not a single mask pattern but a double mask pattern including the first and the second mask patterns is formed by the SADP process. Using the double mask pattern when manufacturing a semiconductor device, a minute pattern may be obtained for the semiconductor device.

However, according to a conventional SADP process, using the first and the second mask patterns, the hard mask layer may not be sufficiently removed from the substrate so that residues of the hard mask layer may remain on the substrate in a process for forming the second mask pattern by removing the hard mask layer. Particularly, if the first mask pattern has a corner structure including a corner portion, an etched amount of the hard mask layer adjacent to the corner portion may be different from an etched amount of the hard mask layer which is formed over the first mask pattern, thereby leaving residues near an inner side wall of a corner portion, so that the mask structure may not be precisely formed on the substrate.

Hence, the conventional SADP process may undesirably leave residues from the hard mask layer on a substrate, thereby preventing formation of a minute pattern on the substrate.

SUMMARY OF THE INVENTION

According to some embodiments of the present invention, methods of forming mask structures capable of being applied to form a minute pattern are provided.

According to some embodiments of the present invention provide methods of forming minute patterns using mask structures.

According to an embodiment of the present invention, there is provided a method of forming a mask structure. A first mask is formed on a substrate, wherein the first mask includes a first mask pattern having a plurality of mask pattern portions with openings therebetween, and a second mask pattern having a corner portion with a curved inner side wall. A sacrificial layer is successively formed on the first mask pattern. A hard mask layer is formed on the sacrificial layer. The hard mask layer is partially removed until the sacrificial layer adjacent to the corner portion is exposed. Then, the sacrificial layer is removed so that a second mask pattern is formed from the hard mask layer remaining in the opening.

According to an embodiment of the present invention, the first mask may have an etching rate substantially the same as that of the second mask. The sacrificial layer may have an etching selectivity relative to the first mask.

According to some embodiments of the present invention, the first mask may be formed using a material substantially the same as that of the second mask. The sacrificial layer may be formed using a material different from that of the first mask.

According to some embodiments of the present invention, the first and the second masks may be formed using polysilicon. The sacrificial layer may be formed using metal oxide.

According to some embodiments of the present invention, the sacrificial layer may be formed by an atomic layer deposition process.

According to some embodiments of the present invention, the hard mask layer is partially removed by an isotropic etching process.

According to another aspect of the present invention, there is provided a method of forming a minute pattern. In forming the minute pattern, an insulating interlayer is formed on a substrate. A first mask is formed on the insulating interlayer. Here, the first mask includes a first mask pattern having a plurality of mask pattern portions having openings therebetween and a second mask pattern having a corner portion of which an inner side wall is curved. A sacrificial layer is formed on the first mask. A hard mask layer is formed on the sacrificial layer. The hard mask layer is removed until a side wall of the sacrificial layer adjacent to the corner portion is exposed. The sacrificial layer is removed so that a second mask pattern is formed from the hard mask layer remaining in the opening. The insulating interlayer is partially etched using the first and the second masks as etching masks to form an insulating interlayer pattern on the substrate.

According to some embodiments of the present invention, the first mask may have an etching rate substantially the same as that of the second mask. The sacrificial layer may have an etching selectivity relative to the first mask.

According to some embodiments of the present invention, the first mask may be formed using a material substantially the same as that of the second mask and the sacrificial layer may be formed using a material different from that of the first mask.

According to some embodiments of the present invention, the first and the second masks may be formed using polysilicon, and the sacrificial layer may be formed using metal oxide.

According to some embodiments of the present invention, the sacrificial layer may be formed by an atomic layer deposition process.

According to some embodiments of the present invention, the hard mask layer may be partially removed by an isotropic etching process.

According to some embodiments of the present invention, an insulating interlayer pattern may be formed on a substrate using a double mask pattern including first and second masks as an etching mask. Thus, the insulating interlayer pattern having a finer structure may be formed on the substrate. Further, the second mask pattern is formed to have a corner portion of which an inner side wall is curved. Thus, a hard mask layer formed over a corner portion may have a thickness relatively smaller than that of the hard mask layer formed over the first mask pattern. The hard mask layer may be partially removed until a portion of the hard mask layer formed adjacent to the corner portion is exposed. As a result, residues of the hard mask layer may not remain over the corner portion during a process for partially removing the hard mask layer. Further, an etched amount of the hard mask layer adjacent to the corner portion may be substantially the same as an etched amount of the hard mask layer formed apart from the first mask pattern, thereby preventing defects from being generated due to overetch.

BRIEF DESCRIPTION OF THE DRAWINGS

The above and other features and advantages of the present invention will become more apparent by describing some embodiments thereof with reference to the accompanying drawings, in which.

DESCRIPTION OF EMBODIMENTS OF THE INVENTION

Figure 1A:
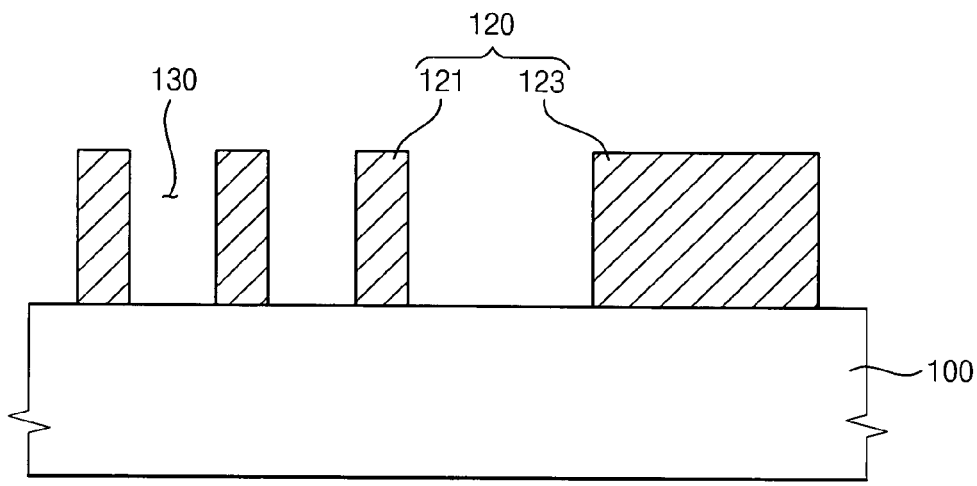
FIGS. 1A to 1E are cross-sectional views illustrating a method of forming a mask structure in accordance with some embodiments of the present invention.

The present invention is described more fully hereinafter with reference to the accompanying drawings, in which embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Some embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Method of Forming a Mask Structure

Figure 2:
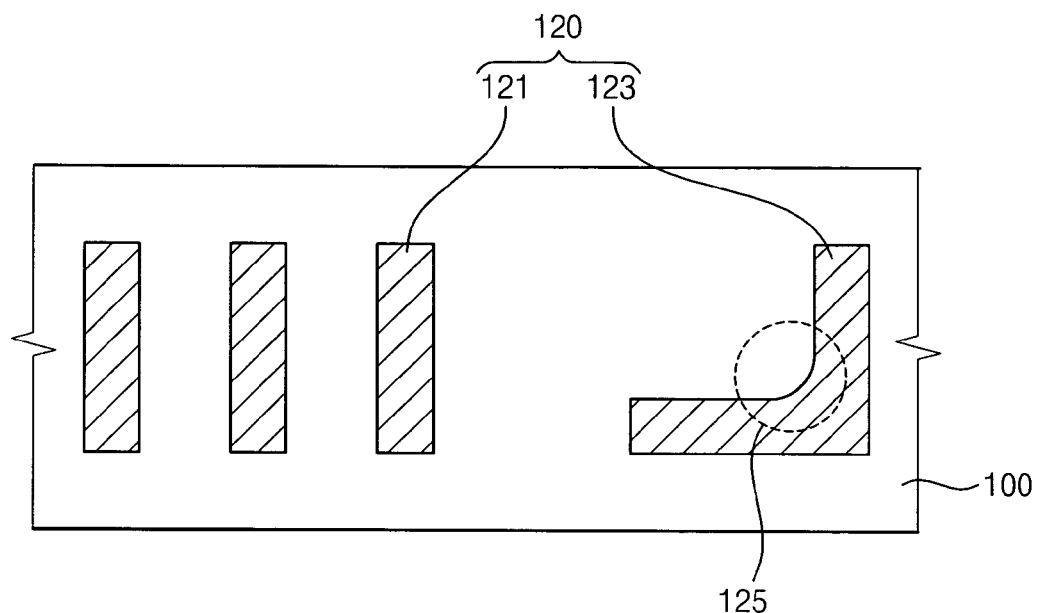
FIG. 2 is a plan view of the substrate of FIG. 1A illustrating a first mask.
Figure 3:
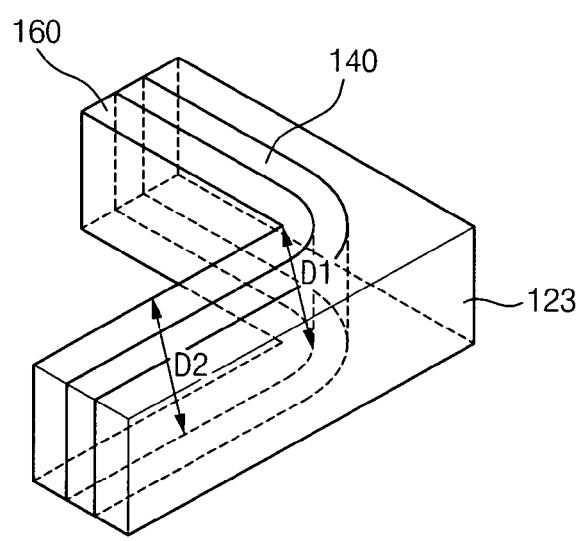
FIG. 3 is a perspective view illustrating a status in which a hard mask layer is removed in FIG. 1D.

FIGS. 1A to 1E are cross-sectional views of a substrate 100 illustrating a method of forming a mask structure in accordance with some embodiments of the present invention. FIG. 2 is a plan view of the substrate in FIG. 1A illustrating a first mask. FIG. 3 is a perspective view illustrating a status in which a hard mask layer is removed.

Referring to FIG. 1A, a first mask 120 is formed on a substrate 100.

The substrate 100 may include a semiconductor substrate such as a silicon substrate, a silicon-on-insulator (SOI) substrate, a germanium substrate, a germanium-on-insulator (GOI) substrate, a silicon-germanium substrate, etc.

The first mask 120 may have an etching selectivity relative to a sacrificial layer to be formed by a subsequent process. For example, the first mask 120 may be formed using polysilicon. The first mask 120 may be formed by a photolithography process.

The first mask 120 is formed to have a first mask pattern 121 and a second mask pattern 123 on the substrate 100. The first mask pattern 121 includes a plurality of mask pattern portions. The plurality of mask pattern portions may be spaced apart from each other with openings 130 therebetween. The second mask pattern 123 has a corner structure, as illustrated in FIG. 2. The illustrated second mask pattern 123 includes a corner portion 125 having a curved inner face. According to some embodiments of the present invention, the curvature may be in a range of about 30° to about 70°. For example, the curvature may be about 45°.

The curved inner face of the corner portion 125 may suppress residues from being generated near the corner portion 125 in a subsequent process for removing a hard mask layer.

According to some embodiments of the present invention, the second mask pattern 123 may be formed by a photolithography process. Thus, when a layout of the first mask 120 is adjusted, the second mask pattern 123 may be easily formed to include the corner portion 125 having the curved inner face.

Figure 1B:
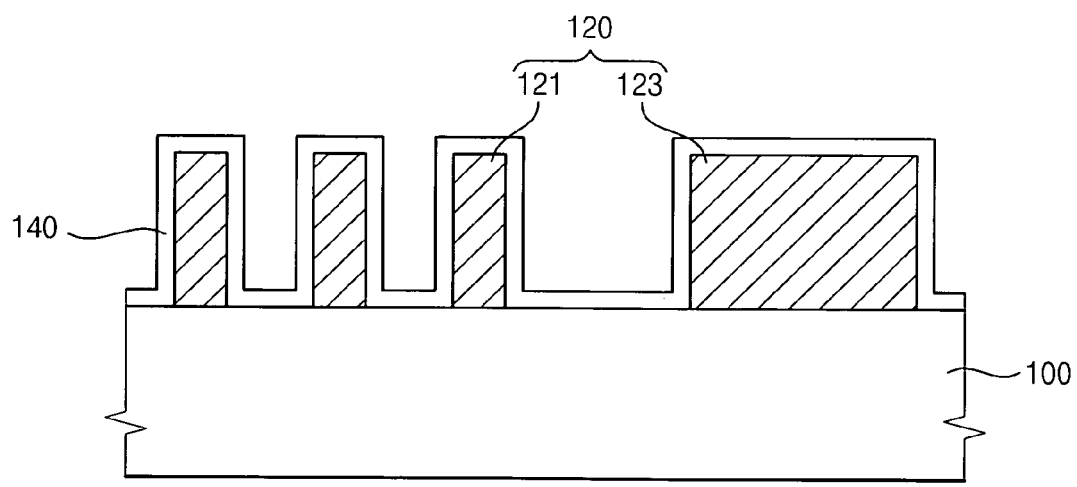

Referring to FIG. 1B, after the first mask 120 having the first mask pattern 121 and the second mask pattern 123 is formed on the substrate 100, a sacrificial layer 140 is formed on the structure as illustrated.

According to some embodiments of the present invention, the sacrificial layer 140 is successively formed on the first mask 120. For example, the sacrificial layer 140 is formed on a side wall and an upper face of the first mask 120, and an exposed face of the substrate 100. The sacrificial layer 140 may have a substantially uniform thickness.

The sacrificial layer 140 may be formed, for example, by a chemical vapor deposition (CVD) process or an atomic layer deposition (ALD) process. When the sacrificial layer 140 is formed by the ALD process, the sacrificial layer 140 may have a uniform thickness because the ALD process may be capable of adjusting a thickness of the sacrificial layer 140 and providing good step coverage.

The sacrificial layer 140 may be formed using a material having an etching selectivity relative to the first mask 120. When the first mask 120 is formed using a polysilicon, the sacrificial layer 140 may be formed using a metal oxide. For example, the sacrificial layer 140 may be formed using tungsten oxide (WO), tantalum oxide (TaO), titanium oxide (TiO), etc.

According to some embodiments of the present invention, the sacrificial layer 140 may be formed using metal oxide by the ALD process.

Figure 1C:
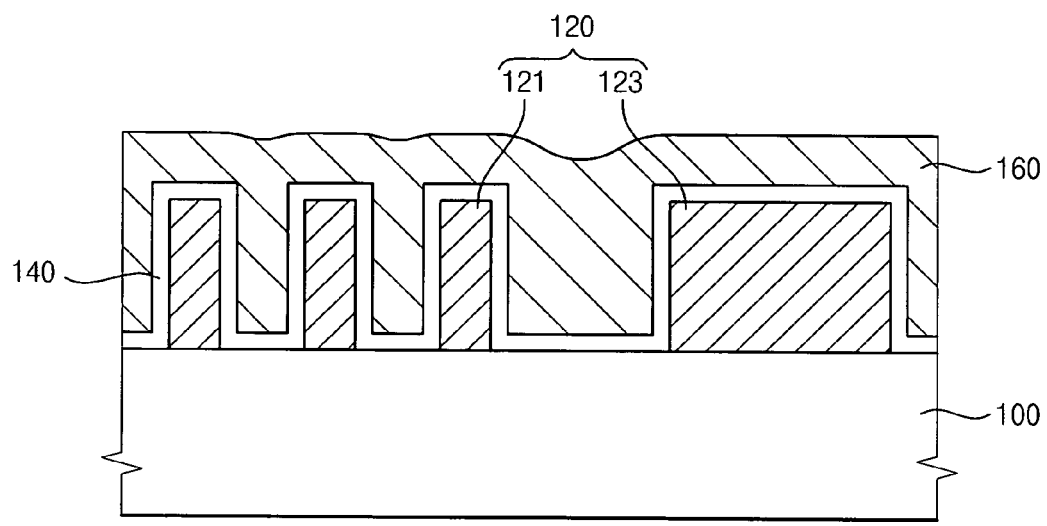

Referring to FIG. 1C, after the sacrificial layer 140 is formed on the resulting structure including the first mask 120, a hard mask layer 160 is formed on the sacrificial layer 140.

The hard mask layer 160 may be formed using a material having the same etching rate as that of the first mask 120 since the second mask pattern, which is to be formed by patterning the hard mask layer 160, may be used as an etching mask together with the first mask 120. Thus, the hard mask layer 160 may include the same material as that included in the first mask 120. For example, when the first mask 120 is formed using polysilicon, the hard mask layer 160 may be formed using polysilicon.

The hard mask layer 160 may be formed using a material having the same etching rate as the first mask 120, whereas the sacrificial layer 140 may have an etching selectivity relative to the first mask 120. Thus, the sacrificial layer 140 may have an etching selectivity with respect to the hard mask layer 160. When the first mask 120 and the hard mask layer 160 are formed using polysilicon, the sacrificial layer 140 may be formed using a metal oxide such as tungsten oxide, titanium oxide, tantalum oxide, etc. However, even though the first mask 120, the hard mask layer 160 and the sacrificial layer 140 are formed using specific materials, materials for the first mask 120, the hard mask layer 160 and the sacrificial layer 140 are not restricted to the first mask 120 having the etching selectivity with respect to the sacrificial layer 140 and the first mask 120 maintaining the same etching rate as that of the hard mask layer 160.

Figure 1D:
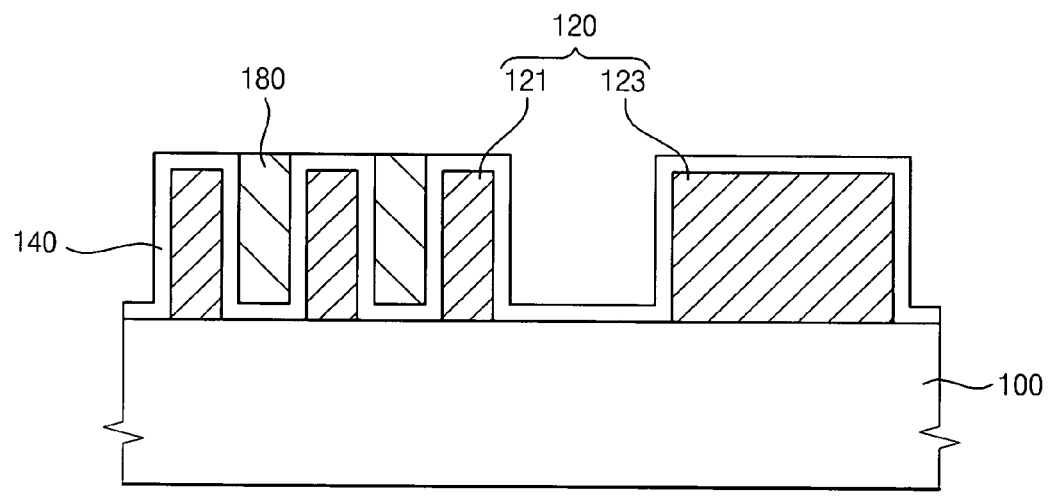

Referring to FIG. 1D, after the hard mask layer 160 is formed on the first mask 120, the hard mask layer 160 is partially removed to form the hard mask pattern 180 in the openings 130. For example, the hard mask layer 160 may be isotropically etched by an etch back process.

When the hard mask layer 160 is partially etched, for example, by an anisotropic etching process, a side well may be abnormally formed near the sidewall of the first mask 120. Thus, the isotropic etching process for partially removing the hard mask layer 160 may be performed in order to suppress a side well from being generated near the sidewall of the first mask 120.

Further, the hard mask layer 160 is removed until a side wall of the sacrificial layer 140 adjacent to the corner portion 125 (see FIG. 2) of the second mask pattern 123 is partially exposed. That is, the hard mask layer 160 is removed by an end point when the side wall of the sacrificial layer 140 near the corner portion 125 is exposed.

Meanwhile, an etched amount of the hard mask layer 160 adjacent to the corner portion 125 of the second mask pattern 123 may be substantially coincident to an etched amount of the hard mask layer 160, which is formed on the second mask pattern 123. As illustrated in FIG. 3, the hard mask layer 160 is formed to have a first portion adjacent to the corner portion 125 and a second portion apart from the corner portion 125. A first etching thickness D1 of the first portion is substantially the same as a second etching thickness D2 of the second portion. Thus, when the hard mask layer 160 is removed until the side wall of the sacrificial layer 140 near the corner portion 125 (see FIG. 2) of the second mask pattern 123 is exposed, residues may not be generated and the hard mask layer pattern 180 may be selectively formed in the opening 130. According to some embodiments of the present invention, the second mask pattern 123 includes a corner portion 125 having a curved inner face. Here, residues of the hard mask layer 160 may not remain near the corner portion 125 after partially removing the hard mask layer 160.

Figure 1E:
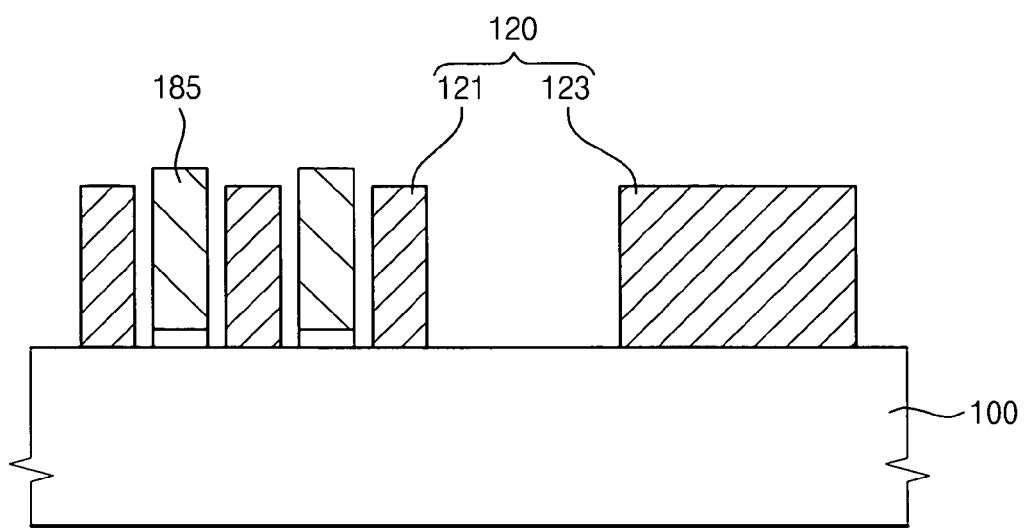

Referring to FIG. 1E, after the hard mask layer 160 is partially removed from the substrate 100, the sacrificial layer 140 is removed from the substrate 100. That is, a portion of the sacrificial layer 140, which is exposed after partially removing the hard mask layer 160, is removed from the substrate 100, as illustrated.

When the sacrificial layer 140 is partially removed, the hard mask layer pattern 180 that is formed in the opening 130 corresponds to a second mask 185. As a result, a mask structure including the first and the second masks 120 and 185 is formed on the substrate 100.

According to some embodiments of the present invention, the second mask pattern 123 includes a corner portion 125 having a curved inner face such that the second mask 185 may be formed without generating residues on the hard mask layer adjacent to the corner portion 125.

If a method of forming a mask structure is applied for manufacturing a semiconductor device, failures caused by the residues may not occur in a process for forming a minute pattern. Thus, example embodiments of the present invention concerning a method of forming a mask structure may be capable of being applied for manufacturing a semiconductor device.

Method of Forming a Minute Pattern

Figure 4A:
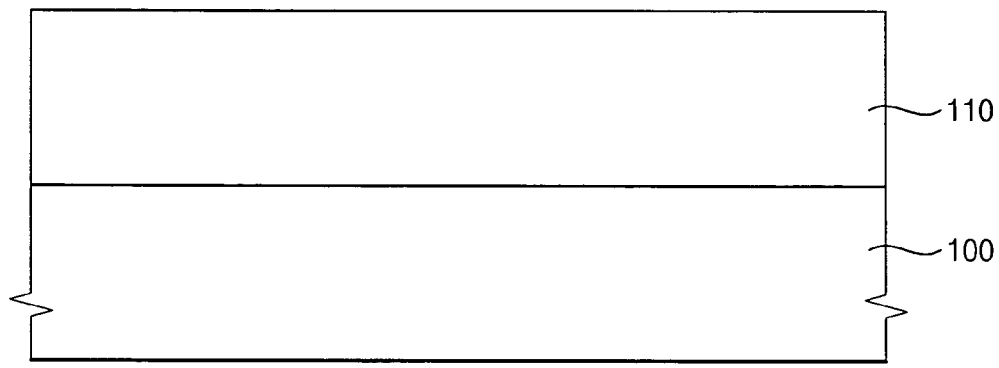
FIGS. 4A to 4C are cross-sectional views of a substrate illustrating a method of forming a minute pattern in accordance with some embodiments of the present invention.
Figure 4B:
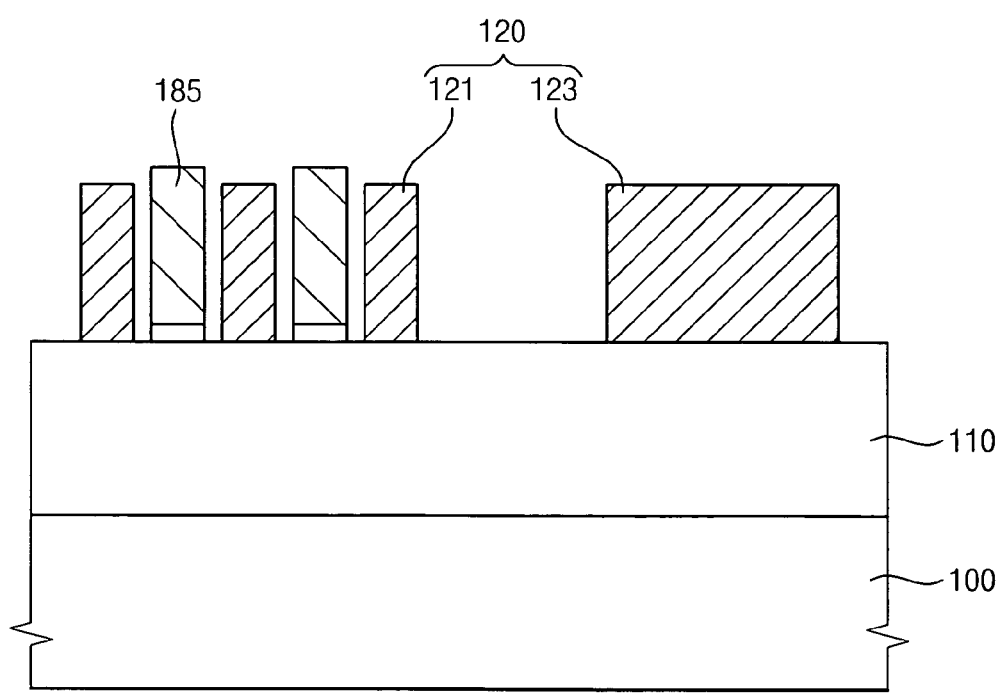
Figure 4C:
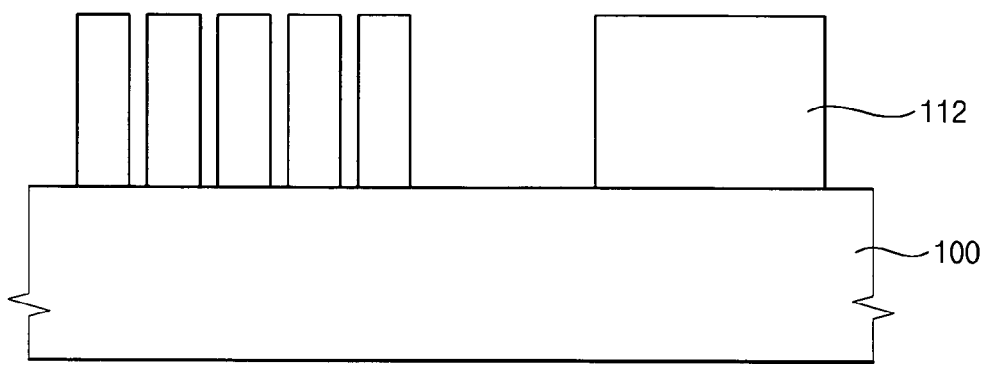

FIGS. 4A to 4C are cross-sectional views of a substrate 100 illustrating a method of forming a minute pattern in accordance with some embodiments of the present invention. In FIGS. 4A to 4C, processes for forming a mask structure may be substantially the same as or similar to those illustrated with reference to FIGS. 1A to 1E. Thus, the same reference numerals in FIGS. 4A to 4C refer to substantially the same elements in FIGS. 1A to 1E.

Referring to FIG. 4A, an insulating interlayer 110 is formed on a substrate 100. The insulating interlayer 110 may have an etching selectivity with respect to a first mask 120, a second mask 185 and a sacrificial layer 140, respectively. Thus, the first and the second masks 120 and 185 may be capable of serving as an etching mask in a process for forming an insulating interlayer pattern from the insulating interlayer 110. Further, after removing the sacrificial layer 140, the insulating interlayer 110 may be partially exposed. The exposed insulating interlayer 110 may serve as an etch stop layer while removing the sacrificial layer 140.

According to some embodiments of the present invention, the first and the second masks 120 and 185 are formed using polysilicon. The sacrificial layer 140 is formed using a metal oxide such as tungsten oxide, titanium oxide, tantalum oxide, etc. The insulating interlayer 110 is formed using silicon oxide.

When the insulating interlayer 110 is formed using silicon oxide, the insulating interlayer 110 may be formed by, for example, a thermal oxidation process, a radical oxidation process, a CVD process, etc. For example, the insulating interlayer 110 may be formed by the CVD process.

Referring to FIG. 4B, the processes for forming a mask structure illustrated with reference to FIGS. 1A to 1E, are carried out to form the first mask 120 and the second mask 185 on the insulating interlayer 110. That is, a mask structure including the first and the second masks 120 and 185 is formed on the insulating interlayer 110. The illustrated mask structure is referred to as a double mask pattern.

According to some embodiments of the present invention, the mask structure is formed on the insulating interlayer 110 by the processes illustrated with reference to FIGS. 1A to 1E. Thus, residues may not be generated when forming the first and the second masks 120 and 185.

Referring to FIG. 4C, the insulating interlayer 110 is partially removed from the substrate 100 to form an insulating interlayer pattern 112 on the substrate 100. For example, the insulating interlayer 110 may be partially etched using the mask structure as an etching mask.

According to some embodiments of the present invention, the insulating interlayer 110 is partially etched using the mask structure, which is capable of preventing the residues from being generated, as an etching mask. Thus, the insulating interlayer pattern 112 may be formed without defects.

Although not shown in FIG. 4C, after the insulating interlayer pattern 112 is formed, a process for forming a minute pattern using the insulating interlayer pattern 112 as a mold layer pattern may be further performed.

According to some embodiments of the present invention, a mask structure including a first mask and a second mask may be easily formed without generating residues. Additionally, when the mask structure without the residues is applied for manufacturing a semiconductor device, a minute pattern may be easily achieved.

As a result, some embodiments of the present invention may be adapted to manufacture a semiconductor device having a finer structure, thereby improving the reliability of manufacturing thereof.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of manufacturing a mask structure, comprising:
   forming a first mask on a substrate, the first mask including a first mask pattern having a plurality of mask pattern portions having openings therebetween, and a second mask pattern having a corner portion of which an inner side wall is curved;
   forming a sacrificial layer on the first mask;
   forming a hard mask layer on the sacrificial layer;
   partially removing the hard mask layer until the sacrificial layer adjacent to the corner portion is exposed; and
   removing the sacrificial layer to form a second mask from the hard mask layer remaining in the opening.

2. The method of claim 1, wherein the first mask has an etching rate substantially the same as that of the second mask, and wherein the sacrificial layer has an etching selectivity relative to the first mask.

3. The method of claim 1, wherein the first mask is formed using a material substantially the same as that of the second mask, and wherein the sacrificial layer is formed using a material different from that of the first mask.

4. The method of claim 3, wherein the first and the second masks are formed using polysilicon, and wherein the sacrificial layer is formed using metal oxide.

5. The method of claim 1, wherein the sacrificial layer is formed by an atomic layer deposition process.

6. The method of claim 1, wherein the hard mask layer is partially removed by an isotropic etching process.

7. A method of forming a minute pattern on a substrate, comprising:
   forming an insulating interlayer on a substrate;
   forming a first mask on the insulating interlayer, the first mask including a first mask pattern having a plurality of mask pattern portions having openings therebetween and a second mask pattern having a corner portion with a curved inner side wall;
   forming a sacrificial layer on the first mask;
   forming a hard mask layer on the sacrificial layer;

partially removing the hard mask layer until a side wall of the sacrificial layer adjacent to the corner portion is exposed;

removing the sacrificial layer to form a second mask from the hard mask layer remaining in the opening; and partially etching the insulating interlayer using the first and the second masks as etching masks to form an insulating interlayer pattern on the substrate.

8. The method of claim 7, wherein the first mask has an etching rate substantially the same as that of the second mask, and wherein the sacrificial layer has an etching selectivity relative to the first mask.

9. The method of claim 7, wherein the first mask is formed using a material substantially the same as that of the second mask, and wherein the sacrificial layer is formed using a material different from that of the first mask.

10. The method of claim 9, wherein the first and the second masks are formed using polysilicon, and wherein the sacrificial layer is formed using a metal oxide.

11. The method of claim 7, wherein the sacrificial layer is formed by an atomic layer deposition process.

12. The method of claim 1, wherein the hard mask layer is partially removed by an isotropic etching process.

* * * * *